United States Patent
Cheng et al.

(10) Patent No.: US 10,514,132 B2
(45) Date of Patent: Dec. 24, 2019

(54) APPARATUS HAVING ELECTROLUMINESCENT QUANTUM DOTS

(71) Applicant: SABIC Global Technologies B.V., Bergen op Zoom (NL)

(72) Inventors: Yingjun Cheng, Shanghai (CN); Andries Jakobus Petrus Van Zyl, Bergen op Zoom (NL); Libo Wu, Shanghai (CN)

(73) Assignee: SABIC Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 15/752,944

(22) PCT Filed: Aug. 24, 2016

(86) PCT No.: PCT/IB2016/055055
§ 371 (c)(1),
(2) Date: Feb. 15, 2018

(87) PCT Pub. No.: WO2017/033137
PCT Pub. Date: Mar. 2, 2017

(65) Prior Publication Data
US 2018/0245742 A1    Aug. 30, 2018

Related U.S. Application Data

(60) Provisional application No. 62/210,716, filed on Aug. 27, 2015.

(51) Int. Cl.
*F21K 9/232* (2016.01)
*C09K 11/02* (2006.01)
(Continued)

(52) U.S. Cl.
CPC ............... *F21K 9/232* (2016.08); *C09K 11/02* (2013.01); *C09K 11/08* (2013.01); *F21K 9/237* (2016.08);
(Continued)

(58) Field of Classification Search
CPC ....... F21K 9/232; H05B 33/145; H01L 33/62; H01L 51/502
(Continued)

(56) References Cited

U.S. PATENT DOCUMENTS 7,888,700 B2 *   2/2011   Kahen ............... H01L 33/18
                                                    257/103
8,496,341 B2 *   7/2013   Kawata ............. F21V 5/004
                                                    362/84

(Continued)

FOREIGN PATENT DOCUMENTS

EP        2214218 A2      8/2010
JP        2012-124158 A   6/2012

OTHER PUBLICATIONS

International Patent Application No. PCT/IB2016/055055; Int'l Search Report and the Written Opinion; dated Nov. 9, 2016; 15 pages.
(Continued)

*Primary Examiner* — William N Harris
(74) *Attorney, Agent, or Firm* — Baker Hostetler

(57) ABSTRACT

A lighting apparatus includes a housing, an electroluminescent quantum dots (QD) unit as a light source, and an electrical component for providing electrical energy to the electroluminescent QD unit. The housing may be in the form of an incandescent bulb, a halogen bulb, a fluorescent tube or a panel. The electroluminescent QD unit includes a plurality of QDs printed on an insulating substrate. The substrate may be flexible so that the electroluminescent QD (Continued)

unit may be bent or curved to conform to the shape of an incandescent bulb, fluorescent tube or panel or a halogen filament so as to mimic these traditional light sources. Methods for retrofitting traditional or LED light fixtures with a lighting apparatus including an electroluminescent quantum dots (QD) unit as a light source are also described.

20 Claims, 7 Drawing Sheets

(51) Int. Cl.
      *H05B 33/14* (2006.01)
      *F21K 9/27* (2016.01)
      *C09K 11/08* (2006.01)
      *F21K 9/66* (2016.01)
      *F21K 9/275* (2016.01)
      *F21K 9/238* (2016.01)
      *F21K 9/237* (2016.01)
      *H01L 33/06* (2010.01)
      *H01L 33/62* (2010.01)
      *H01L 51/50* (2006.01)
      *F21Y 115/00* (2016.01)
      *F21Y 105/00* (2016.01)
      *F21Y 115/10* (2016.01)
      *F21Y 105/10* (2016.01)

(52) U.S. Cl.
    CPC ............... *F21K 9/238* (2016.08); *F21K 9/27* (2016.08); *F21K 9/275* (2016.08); *F21K 9/66* (2016.08); *H01L 33/06* (2013.01); *H01L 33/62* (2013.01); *H01L 51/502* (2013.01); *H05B 33/145* (2013.01); *F21Y 2105/00* (2013.01); *F21Y 2105/10* (2016.08); *F21Y 2115/00* (2016.08); *F21Y 2115/10* (2016.08); *Y02B 20/386* (2013.01)

(58) Field of Classification Search
    USPC .............................................. 362/84; 313/503
    See application file for complete search history.

(56) References Cited

U.S. PATENT DOCUMENTS

| | | | |
|---|---|---|---|
| 8,669,702 B2* | 3/2014 | Seo ................ | H01L 51/524 313/504 |
| 2008/0180020 A1* | 7/2008 | Cok ................ | H05B 33/28 313/503 |
| 2009/0109435 A1* | 4/2009 | Kahen ............. | C09K 11/883 356/317 |
| 2009/0268461 A1 | 10/2009 | Deak et al. | |
| 2011/0175528 A1 | 7/2011 | Rains et al. | |
| 2011/0199753 A1* | 8/2011 | Ramer ............. | F21K 9/00 362/84 |
| 2013/0271972 A1 | 10/2013 | Hussell et al. | |
| 2017/0064792 A1* | 3/2017 | Yakhshi-Tafti ...... | H05B 33/145 |

OTHER PUBLICATIONS

Supran et al.; "QLEDs for displays and solid-state lighting"; Material Research Society; vol. 38; Sep. 2013; p. 703-711.

\* cited by examiner

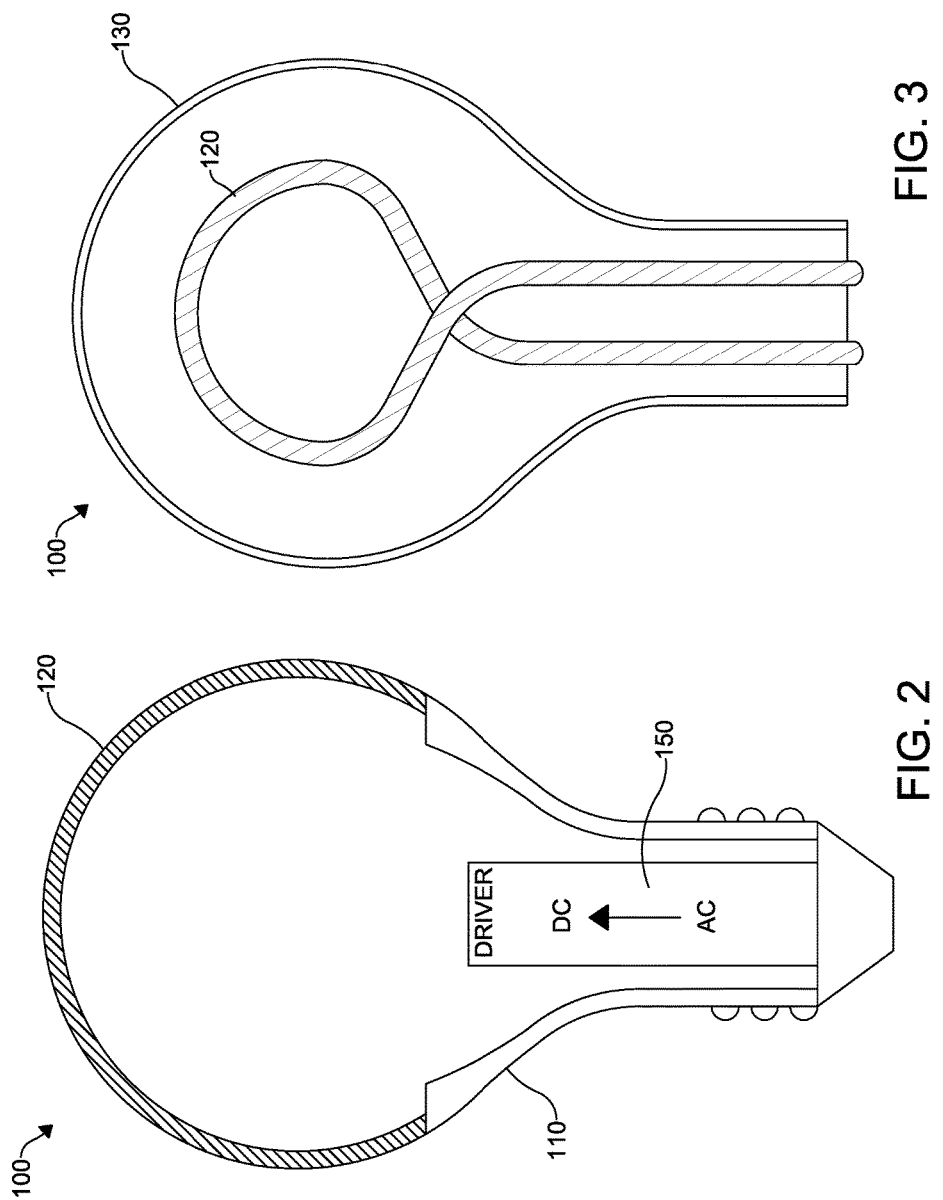

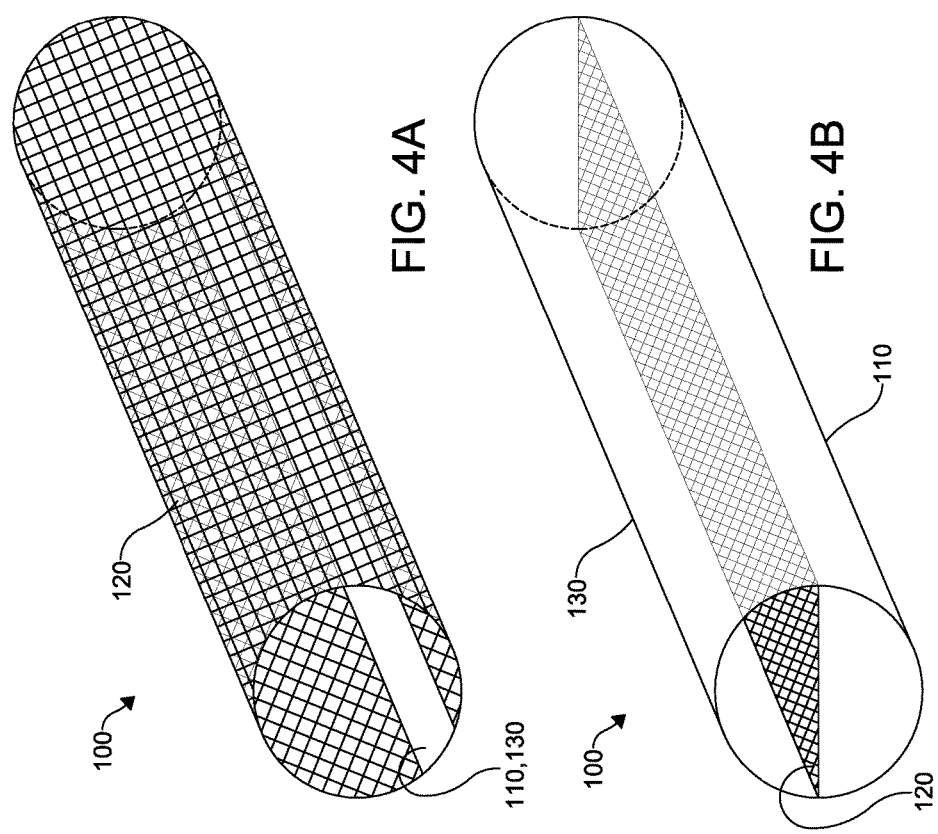

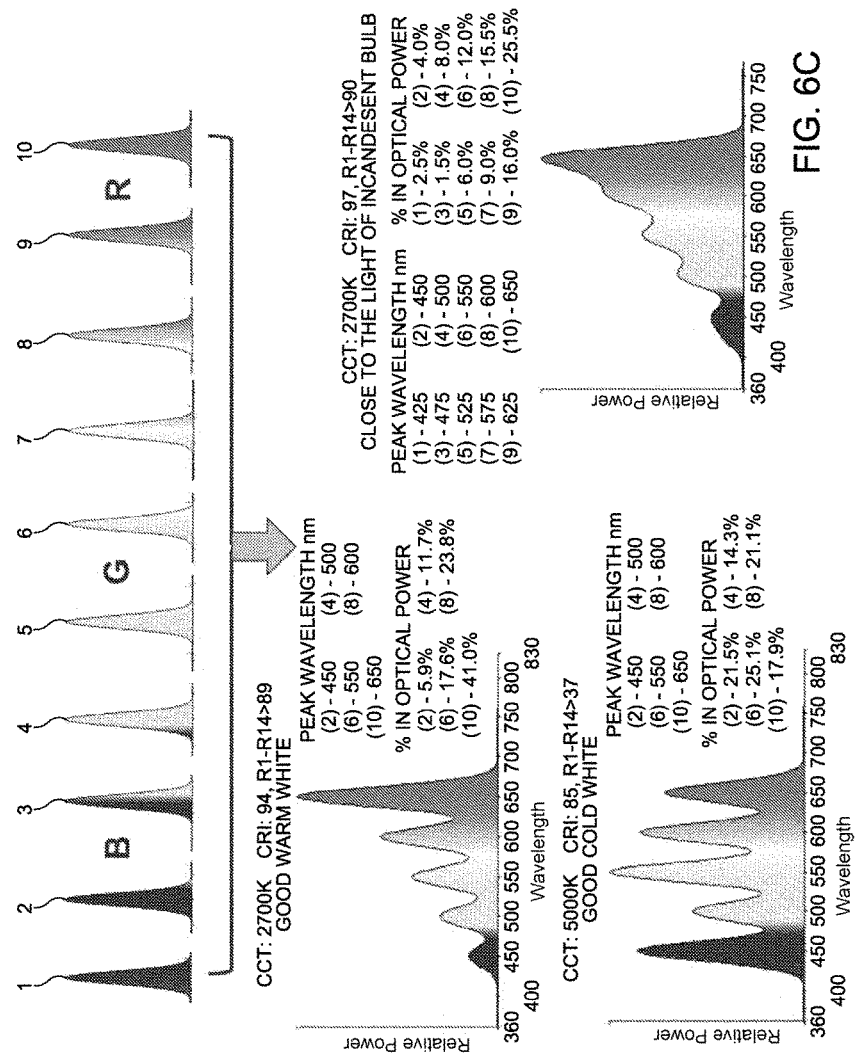

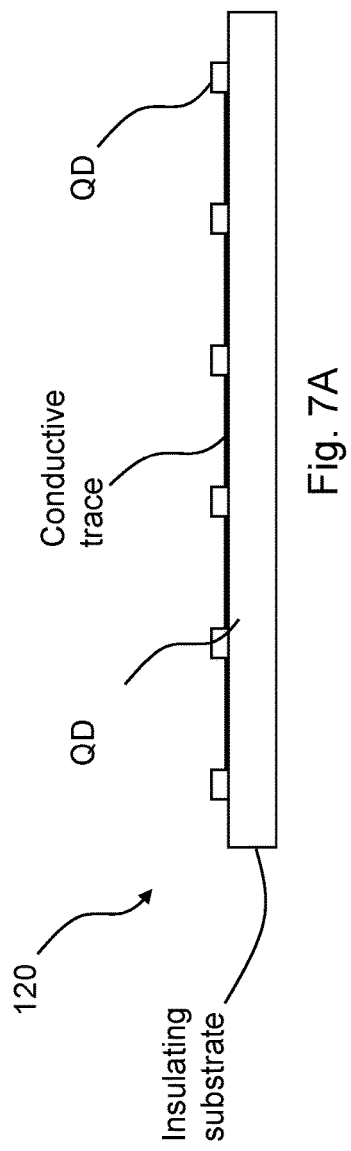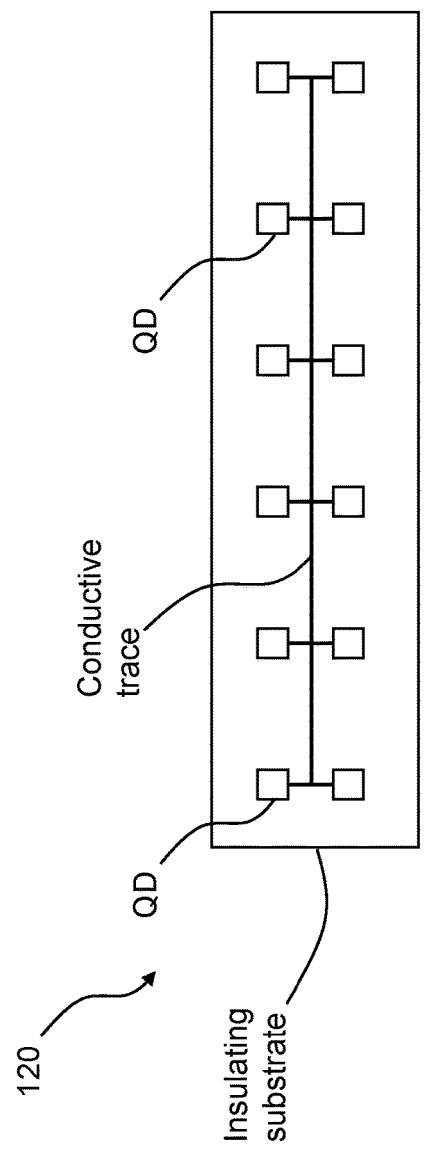

APPARATUS HAVING ELECTROLUMINESCENT QUANTUM DOTS

CROSS REFERENCE TO RELATED APPLICATIONS

This application is the National Stage of International Application No. PCT/IB2016/055055 filed Aug. 24, 2016, which claims the benefit of U.S. Provisional Application No. 62/210,716 filed Aug. 27, 2015, the disclosures of which are incorporated herein by this reference in their entireties.

FIELD OF DISCLOSURE

The present disclosure relates to an apparatus, such as a lighting apparatus, and more particularly to an apparatus incorporating electroluminescent quantum dots therein as the light source.

BACKGROUND OF THE DISCLOSURE

Direct conversion of electricity into light using semiconductor-based light-emitting diodes (LEDs) is widely accepted one of the most promising approaches to more efficient lighting. LEDs demonstrate high brightness, long operational lifetime, and low energy consumption performance that far surpass that of conventional lighting systems such as incandescent and fluorescent light sources. The LED field is currently dominated by semiconductor quantum-well emitters (based, e.g., on InGaN/GaN) fabricated by epitaxial methods on crystalline substrates (e.g., sapphire). These structures are highly efficient, reliable, mature and bright, but structural defects at the substrate and semiconductor interface caused by lattice mismatch and heating during operation generally limits such devices to point light source with limited flexible compatibility.

OLEDs are easily amendable to low-temperature, large-area processing, including fabrication on flexible substrates. Synthetic organic chemistry provides essentially an unlimited number of degrees of freedom for tailoring molecular properties to achieve specific functionality, from selective charge transport to color-tunable light emission. The prospect of high-quality lighting sources based on inexpensive "plastic" materials has driven a tremendous amount of research in the area of OLEDs, which in turn has led to the realization of several OLED-based high-tech products such as flat screen televisions and mobile communication devices. Several industrial giants such as Samsung, LG, Sony, and Panasonic are working to develop large-area white-emitting OLEDs both for lighting and display. Despite advances in the OLED field, there are a few drawbacks of this technology that might prevent its widespread use in commercial products. One problem is poor cost-efficiency caused at least in part by the complexity of the necessary device architecture, which requires multiple thermal deposition steps during manufacture. Another problem is their limited stability, particularly for deep-red and blue phosphorescent OLEDs. While improving greatly in recent years, they still do not meet the standards employed in high-end devices.

Chemically synthesized nanocrystal quantum dots (QDs) have emerged as a promising class of emissive materials for low-cost yet efficient LEDs. These luminescent nanomaterials feature size-controlled tunable emission wavelengths and provide improvements in color purity, stability and durability over organic molecules. In addition, as with organic materials, colloidal QDs can be fabricated and processed via inexpensive solution-based techniques compatible with lightweight, flexible substrates. Moreover, similar to other semiconductor materials, colloidal QDs feature almost continuous above-band-edge absorption and a narrow emission spectrum at near-band-edge energies. Distinct from bulk semiconductors, however, the optical spectra of QDs depend directly on their size. Specifically, their emission color can be continuously tuned from the infrared (IR) to ultraviolet (UV) by varying QD size and/or composition. The wide range spectral tunability is combined with high photoluminescence quantum yields that approach unity in well-passivated structures. These unique properties of QDs have been explored for use in various devices such as LEDs, lasers, solar cells, and photo detectors.

Nonetheless, semiconductor-based LEDs remain the most widely used solid state replacement light source. Retrofit of traditional lighting devices such as indoor lamps (bulb, tube, spot light, down light, etc.), professional luminaires (torches, table lamps, track light, etc.) and outdoor road lights with these LED-based solutions continues due to the energy savings, long lifetime, digitalization and cost reduction provided by LED as compared to that of traditional incandescent bulb, fluorescent and high-intensity discharge light sources.

BRIEF DESCRIPTION OF THE FIGURES

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 2 depicts another exemplary aspect of a quantum dots unit for light generation incorporated into a mechanical component in the form of an incandescent bulb.

FIG. 3 depicts an exemplary quantum dots unit for light generation incorporated into a mechanical component in the form of a halogen bulb.

FIGS. 4A and 4B depict exemplary quantum dot units for light generation incorporated into mechanical components in the form of fluorescent tubes.

FIGS. 6A to 6C depict exemplary high quality warm and cold white light generation with monochromatic quantum dot emissions having various wavelengths with appropriate spectral power distributions.

FIG. 7A and 7B are top and side views, respectively, of an exemplary electroluminescent quantum dot unit.

SUMMARY

Figure 1A:
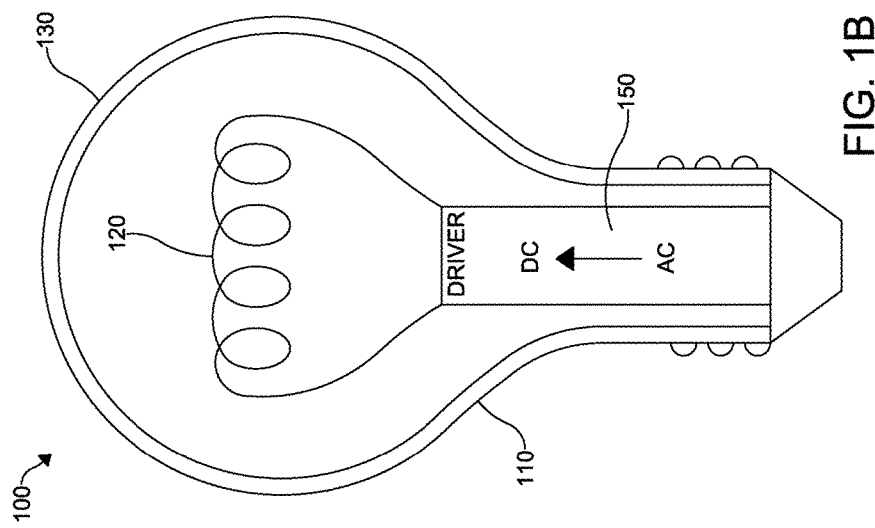
FIGS. 1A and 1B depict exemplary quantum dots units for light generation incorporated into a mechanical component in the form of an incandescent bulb.

Aspects of the present disclosure relate to an apparatus including: a housing; an electroluminescent quantum dots (QD) unit as a light source; and an electrical component for providing electrical energy to the electroluminescent QD unit. The housing may be in a form of an incandescent bulb, a halogen bulb, a fluorescent tube or a panel. The apparatus may include an optical component for diffusing light generated by the electroluminescent QD unit.

In certain aspects, the optical component includes a polymeric or glass material, such as acrylic, polycarbonate, silicone, polyester or a combination thereof The housing in some aspects may include one or more of a metal, glass and polymeric material.

The electroluminescent QD unit may include a plurality of QDs printed on an insulating substrate. In one aspect the QDs on the electroluminescent QD unit are electrically connected to the electrical component by conductive traces located on the insulating substrate. In certain aspects the insulating substrate includes a glass or polymeric material. The insulating substrate is a flexible polymeric material in particular aspects. In yet other aspects the insulating substrate is curved such that: the electroluminescent QD unit conforms to an outer shape of an incandescent bulb or a panel; or the electroluminescent QD unit is shaped into a form of a halogen filament and includes conductive electrodes attached thereto for providing power to the electroluminescent QD unit.

The electrical component may be located within or on the housing or outside the housing of the apparatus.

In various aspects the electroluminescent QD unit includes a plurality of QDs printed on an insulating substrate and the plurality of QDs include chemically synthesized nanocrystal QDs or colloidal QDs.

In some aspects the apparatus is a lighting fixture. In further aspects the light source is a source of ultraviolet light, infrared light or black light. In one particular aspect the apparatus provides high quality warm white light having a color temperature of about 2700 Kelvin (K), a color rendering index of about 97, and each of standard colors R1 to R14 having a value of about 90 or higher.

In an aspect a method for retrofitting an existing lighting fixture includes: removing a first light source from the existing lighting fixture, the existing lighting fixture including a first electrical component; installing a quantum dot (QD) lighting apparatus into the existing lighting fixture, the QD lighting apparatus including a housing and an electroluminescent quantum dots (QD) unit as a second light source; and providing a power supply to the electroluminescent QD unit by using either the first electrical component from the existing lighting fixture or a second electrical component provided with the QD lighting apparatus. In certain aspects the housing is in a form of an incandescent bulb, a halogen bulb, a fluorescent tube or a panel. In some aspects the first light source is an incandescent bulb, a halogen bulb, a fluorescent tube or a panel. In other aspects the first light source is a light emitting diode (LED) light source in a form of an incandescent bulb, a halogen bulb, a fluorescent tube or a panel.

DETAILED DESCRIPTION

The present disclosure can be understood more readily by reference to the following detailed description of the disclosure and the Examples included therein. In various aspects, the present disclosure pertains to apparatus, such as but not limited to a lighting apparatus, incorporating electroluminescent quantum dots (QDs) as the light source, the apparatus comprising a housing for protecting the QD unit and optionally providing optical components for diffusion of light generated by the QD unit. The apparatus includes an electrical component for providing power to the QD unit. In an aspect, the apparatus provides high quality warm white and cold light with high color rendering and good color saturation properties on a flexible substrate; properties which cannot be achieved with traditional LED retrofit applications.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting.

Various combinations of elements of this disclosure are encompassed by this disclosure, e.g., combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

All publications mentioned herein are incorporated herein by reference to disclose and describe the methods and/or materials in connection with which the publications are cited.

Definitions

It is also to be understood that the terminology used herein is for the purpose of describing particular aspects only and is not intended to be limiting. As used in the specification and in the claims, the term "comprising" can include the embodiments "consisting of" and "consisting essentially of" Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a power supply" includes two or more power supplies.

As used herein, the term "combination" is inclusive of blends, mixtures, alloys, reaction products, and the like.

Ranges can be expressed herein as from one particular value, and/or to another particular value. When such a range is expressed, another aspect includes from the one particular value and/or to the other particular value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not. For example, the phrase "optionally providing optical components" means that the optical components can or cannot be provided and that the description includes both aspects in which optical components are provided and in which they are not.

Unless otherwise stated to the contrary herein, all test standards are the most recent standard in effect at the time of filing this application.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions and it is understood that there are a variety of structures that can perform the same function that are related to the disclosed structures, and that these structures will typically achieve the same result.

Lighting Apparatus Incorporating Quantum Dots as the Light Source

Aspects of the present disclosure relate to an apparatus, including but not limited to a lighting apparatus, incorporating electroluminescent quantum dots (QDs) as the light source. In some aspects, the apparatus includes an electroluminescent QD unit for light generation, a housing for protecting the QD unit and optionally providing optical components for diffusion of light generated by the QD unit. The apparatus includes an electrical component for providing power to the QD unit.

Figure 5A:
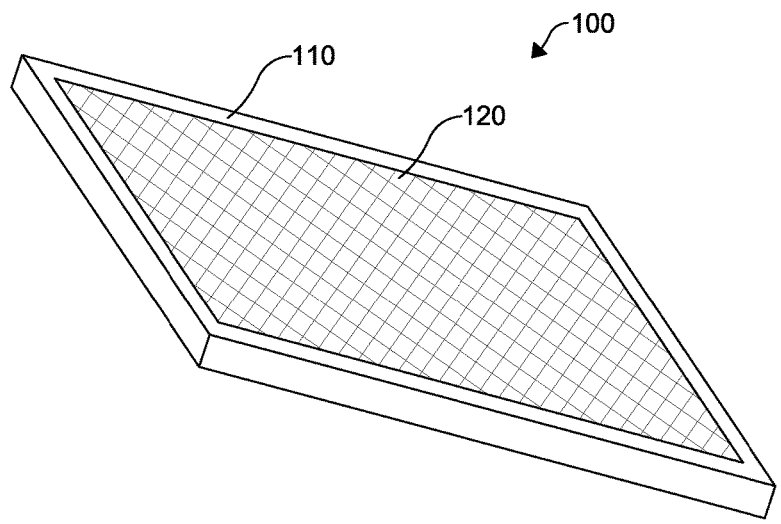
FIGS. 5A and 5B depict exemplary quantum dot units for light generation incorporated into mechanical components in the form of a panel.
Figure 5B:
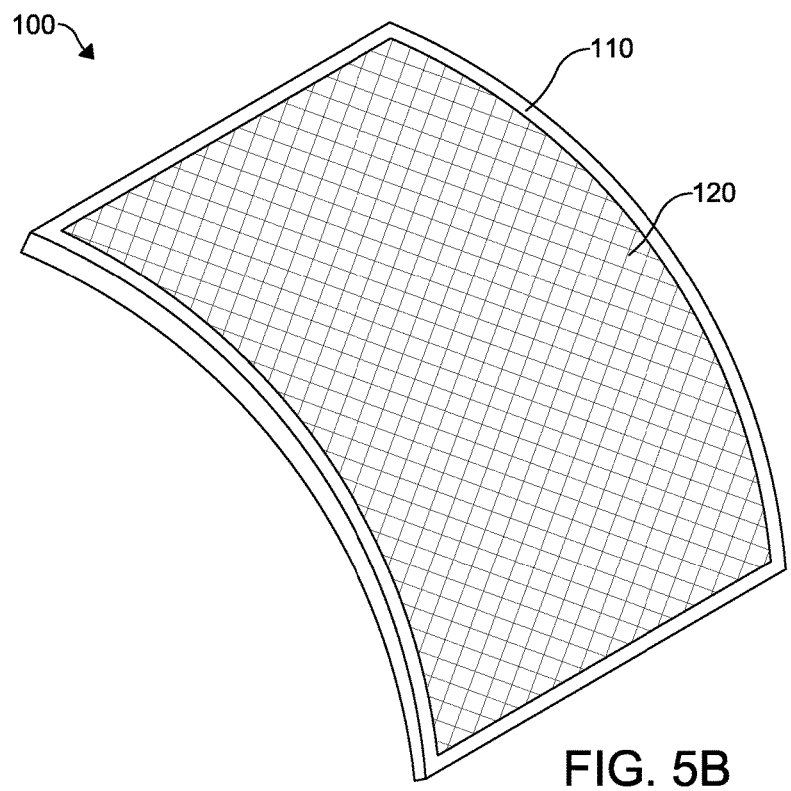

With reference to FIGS. 1-5B, in certain aspects the electroluminescent QD unit is incorporated into an apparatus 100, including but not limited to a lighting apparatus, the apparatus including a housing 110 in the form of an incandescent bulb (FIGS. 1A, 1B and 2), a halogen bulb (FIG. 3), a fluorescent tube (FIGS. 4A and 4B) and a panel (FIGS. 5A and 5B).

The housing protects the electroluminescent QD unit 120, which may be located within the housing 110 as shown in FIGS. 1A, 1B, 3 and 4B. In some aspects the electroluminescent QD unit 120 may be incorporated into or on the housing 110, as shown in FIGS. 2, 4A, 5A and 5B. The housing 110 may also contain an electrical component 150, such as a power supply, for providing power to the electroluminescent QD unit 120. The electrical component 150 is described in further detail below.

The housing 110 may include an optical component 130 to provide for diffusion of light generated by the electroluminescent QD unit 120. The housing 110 may be formed of one or more materials, including but not limited to metal, glass, polymeric/plastic and combinations thereof Exemplary metals include, but are not limited to, metal and aluminum. Exemplary polymeric materials include, but are not limited to, acrylic, polycarbonate, silicone, polyester and combinations thereof The optical component 130, if included in the housing 110, may be formed by one or more of the polymeric or glass materials described herein, although other optical materials are known and could be used.

As shown in the figures, the housing 110 may be shaped into the form of an incandescent bulb, a halogen bulb, a fluorescent tube or a panel so that it may be easily installed into a new or preexisting lighting fixture or other apparatus.

With reference to FIGS. 7A and 7B, in some aspects the electroluminescent QD unit 120 includes a plurality of QDs printed on an insulating substrate. Electrical connection from the electrical component 150 is provided to each of the plurality of QDs printed on the electroluminescent QD unit 120 by conductive traces or other suitable wiring located on the insulating substrate.

The substrate may be a glass, polymeric, or other known insulating material. In one aspect, the substrate is a flexible substrate, such as a flexible polymeric substrate. In such aspects the electroluminescent QD unit 120 can be curved, or bent, into a desired shape. For example, in one aspect illustrated in FIG. 2, the electroluminescent QD unit 120 is curved to conform to the outer shape of an incandescent bulb, so that the light distribution from the QDs is in roughly the same pattern as that of a traditional incandescent bulb. In another aspect illustrated in FIG. 1B, the electroluminescent QD unit 120 is coiled to conform to the shape of a filament of an incandescent bulb, so that the light distribution from the QDs is in roughly the same pattern as that of a traditional incandescent bulb.

In another aspect illustrated in FIG. 3 the electroluminescent QD unit 120 is shaped into the form of a halogen filament and includes conductive electrodes coupled thereto for providing power to the electroluminescent QD unit 120. In yet another aspect illustrated in FIG. 4A the electroluminescent QD unit 120 is shaped into the form of a fluorescent tube. In a further aspect illustrated in FIG. 5B in which the housing 110 is in the form of a panel, the electroluminescent QD unit 120 and the housing 110 are both flexible and shaped into the form of the panel.

The electroluminescent QD unit 120 shown as curved in FIGS. 2, 4A and 5B may form the outer surface of the housing 110 so that an optical component is not necessary. The electroluminescent QD unit 120 may be attached directly to the base of the housing 110 (see, e.g., FIG. 2), or in some aspects could include substantially the entire housing 110—while this is not explicitly illustrated in FIG. 4A, for example, the electroluminescent QD unit 120 of the illustrated aspect is shown as curved around a substantial portion of the tube, but it could instead wrap entirely around the tube and have mechanical and/or electrical connections at the tube ends for retaining the tube in the lighting apparatus 100 and providing power to the electroluminescent QD unit 120.

As discussed, aspects of the disclosure include an electrical component 150 for providing power to the electroluminescent QD unit 120. Like most electronic devices, the electroluminescent QD unit 120 operates on DC power. In contrast, typical residential and commercial power systems from which the lighting apparatus will be powered operate on AC power. Thus, in order to power the lighting apparatus of the present disclosure some means for converting AC power to DC power must be provided.

Figure 1B:
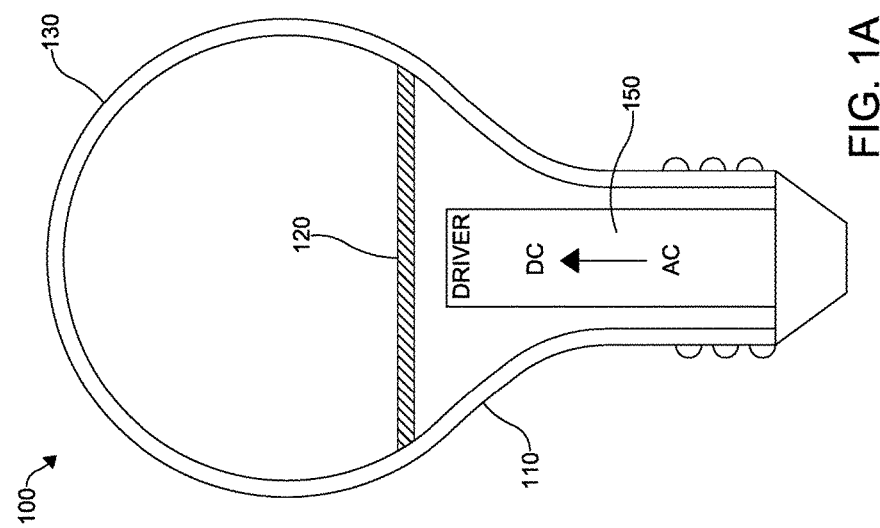

In certain aspects of the present disclosure an electrical component 150 is provided as an electronics driver located within the housing 110 of the lighting apparatus 100, as shown in FIGS. 1A, 1B and 2. In other aspects the electrical component 150 is provided as an electronics driver located outside the housing 110 of the lighting apparatus 100. Such aspects are illustrated in FIGS. 3, 4A-4B and 5A-5B. In these exemplary aspects electrical wires or other suitable connections would be provided from the DC output of the electronics driver to the lighting apparatus 100 so as to provide a path for DC power from the electronics driver to the electroluminescent QD unit 120 and QDs located thereon. It should be noted that while FIGS. 1A, 1B and 2 show aspects of incandescent bulbs having an electrical component 150 located within the housing 110 of the lighting apparatus 100, the electrical component 150 could be located outside the housing 110 in other aspects. Likewise, while FIGS. 3, 4A-4B and 5A-5B show aspects of a halogen bulb, fluorescent tubes and panels having an electrical component 150 located outside the housing 110 of the lighting apparatus 100, the electrical component 150 could be located inside or be incorporated onto the housing 110 in yet other aspects.

The electrical component 150 converts AC power to DC power. In one purely exemplary aspect, the electrical component 150 converts 120 volt (V), 60 Hertz (Hz) alternating current (AC) power to 6V, 100 milliamp (ma)/square centimeter ($cm^2$) DC power.

In certain aspects, the lighting apparatus 100 could be dimmable by allowing the user to adjust the DC power output of the electrical component 150, which would change the power applied to the electroluminescent QD unit 120 and QDs located thereon and thus affect the light output of the QDs.

In some aspects of the present disclosure the QDs may be chemically synthesized nanocrystal QDs. It will be recognized, however, that other types of QDs could be used, including but not limited to colloidal QDs. Suitable methods for making QDs include molecular beam epitax (MBE), ion implantation and X-ray lithography.

As discussed above, the size and composition of the QDs on the electroluminescent QD unit 120 may be selected to provide a desired light output. In some aspects, it may be desirable to select QDs that will provide high quality warm white light (e.g., light having a color temperature of about 2700K, a color rendering index (CRI) of about 97, and each of standard colors R1 to R14 having a value of about 90 or higher). It may be desirable in certain aspects to provide light for decorative or other purposes, including, but not limited to, ultraviolet light, infrared light, and black light, and in such aspects the size and composition of QDs could be adjusted accordingly. The apparatus could thus be useful in applications other than lighting fixtures.

Methods for Retrofitting an Existing Lighting Fixture

Aspects of the present disclosure also include methods for retrofitting an existing lighting fixture with a lighting apparatus 100 incorporating electroluminescent QDs as the light source. The features of the lighting apparatus 100 incorporating electroluminescent QDs as the light source are described above and are not repeated here.

In some aspects of the method the existing lighting fixture will have previously been retrofit with an LED lighting fixture incorporating one or more LED light sources. The LED light source may be, but does not have to be, located in an LED housing in the form of an incandescent bulb, a halogen bulb, a fluorescent tube or a panel. LED light sources may have an LED power supply located in the LED housing or in the existing lighting fixture, similar to the electrical component of aspects of the present disclosure.

The method of retrofitting an existing LED lighting fixture with a lighting apparatus incorporating electroluminescent QDs as the light source includes removing the LED light source from the existing fixture. If the LED light source does not have the LED power supply located in the LED housing, and the LED power supply located outside the LED housing is suitable for providing power to the electroluminescent QD unit, then the LED power supply may be repurposed for use in the lighting apparatus of the present disclosure. If the LED power supply is not suitable for providing power to the electroluminescent QD unit or of the LED power supply is located within the housing of the LED light source (and thus removed from the lighting apparatus), then an electrical component will need to be provided to provide power to the electroluminescent QD unit according to one of the aspects described above (e.g., an electronics driver provided inside or on the housing of the electroluminescent QD unit or outside the housing of the electroluminescent QD unit).

After the LED light source is removed from the existing fixture, a QD lighting apparatus 100 is installed into the lighting fixture. The QD lighting apparatus 100 includes a housing 110 and an electroluminescent QD unit 120 according to aspects described above. If the lighting apparatus 100 includes a suitable pre-existing power supply then the QD lighting apparatus 100 need not include an electrical component; otherwise an electrical component 150 will need to be provided inside, onto, or outside the housing of the QD lighting apparatus 100 according to aspects described above.

In other aspects of the method the existing lighting fixture will not have been retrofit with an LED lighting fixture and will include one or more light sources such as an incandescent bulb, halogen bulb, fluorescent tube or panel.

The method includes removing the existing light source—such as, but not limited to, an incandescent bulb, halogen bulb, fluorescent tube or panel—from the existing lighting fixture. As these light sources are all powered by AC power, an electrical component 150 capable of converting AC power to DC power according to aspects described herein will need to be provided. Thus, after the existing light source is removed from the lighting fixture a QD lighting apparatus 100 is installed into the fixture. The QD lighting apparatus 100 includes a housing 110 and an electroluminescent QD unit 120 according to aspects described herein. The QD lighting apparatus 100 will also include an electrical component 150 either inside, on or outside the housing of the QD lighting apparatus 100 according to aspects described herein.

Lighting apparatuses according aspects of the present disclosure thus offer numerous benefits over state-of-art LED retrofit bulbs, including, but not limited to, the following:

A single electroluminescent QD unit formed from large area solution processing may be used as the light source, in contrast current LED bulb and tube retrofit technology, which require the soldering of multiple LEDs on a metal-core PCB. The manufacturing process of the present disclosure is thus substantially simplified.

By using multiple QDs to customize the spectrum, high quality warm white and cold light with high color rendering and good color saturation can be realized; this is difficult to achieve with LEDs.

In contrast to LED constructions, QDs can be applied on a flexible substrate, which provide the ability to eliminate the optical component such as a bulb cover/tube. The electroluminescent QD unit can be curved or bent directly into the form of a bulb or tube shape to directly replace the pre-existing incandescent bulb, halogen bulb, fluorescent tube, or panel (or their LED equivalent).

ASPECTS OF THE DISCLOSURE

In various aspects, the present invention pertains to and includes at least the following aspects.

Aspect 1: An apparatus comprising:
a. a housing;
b. an electroluminescent quantum dots (QD) unit as a light source; and
c. an electrical component for providing electrical energy to the electroluminescent QD unit,
wherein the housing is in a form of an incandescent bulb, a halogen bulb, a fluorescent tube or a panel.

Aspect 2: The apparatus of aspect 1, comprising an optical component for diffusing light generated by the electroluminescent QD unit.

Aspect 3: The apparatus of aspect 2, wherein the optical component comprises a polymeric or glass material.

Aspect 4: The apparatus according to either of aspects 2 or 3, wherein the optical component comprises acrylic, polycarbonate, silicone, polyester or a combination thereof Aspect 5: The apparatus according to any of the previous aspects, wherein the housing comprises one or more of a metal, glass and polymeric material.

Aspect 6: The apparatus according to any of the previous aspects, wherein the electroluminescent QD unit comprises a plurality of QDs printed on an insulating substrate.

Aspect 7: The apparatus according to aspect 6, wherein the QDs on the electroluminescent QD unit are electrically connected to the electrical component by conductive traces located on the insulating substrate.

Aspect 8: The apparatus according to either of aspects 6 or 7, wherein the insulating substrate comprises a glass or polymeric material.

Aspect 9: The apparatus according to either of aspects 6 to 8, wherein the insulating substrate is a flexible polymeric material.

Aspect 10: The apparatus according to aspect 9, wherein the insulating substrate is curved such that the electroluminescent QD unit conforms to an outer shape of an incandescent bulb or a panel.

Aspect 11: The apparatus according to aspect 9, wherein the insulating substrate is curved such that the electroluminescent QD unit is shaped into a form of a halogen filament and includes conductive electrodes attached thereto for providing power to the electroluminescent QD unit.

Aspect 12: The apparatus according to any of the previous aspects, wherein the electrical component is located within or on the housing of the apparatus.

Aspect 13: The apparatus according to any of the previous aspects, wherein the electrical component is located outside the housing of the apparatus.

Aspect 14: The apparatus according to any of the previous aspects, wherein the electroluminescent QD unit comprises a plurality of QDs printed on an insulating substrate and the plurality of QDs comprise chemically synthesized nanocrystal QDs or colloidal QDs.

Aspect 15: The apparatus according to any of the previous aspects, wherein the apparatus is a lighting fixture.

Aspect 16: The apparatus according to any of the previous aspects, wherein the light source is a source of ultraviolet light, infrared light or black light.

Aspect 17: The apparatus according to any of the previous aspects, wherein the apparatus provides high quality warm white light having a color temperature of about 2700K, a color rendering index of about 97, and each of standard colors R1 to R14 having a value of about 90 or higher.

Aspect 18: A method for retrofitting an existing lighting fixture comprising:
a. removing a first light source from the existing lighting fixture, the existing lighting fixture comprising a first electrical component;
b. installing a quantum dot (QD) lighting apparatus into the existing lighting fixture, the QD lighting apparatus comprising a housing and an electroluminescent quantum dots (QD) unit as a second light source; and
c. providing a power supply to the electroluminescent QD unit by using either the first electrical component from the existing lighting fixture or a second electrical component provided with the QD lighting apparatus,
wherein the housing is in a form of an incandescent bulb, a halogen bulb, a fluorescent tube or a panel.

Aspect 19: The method of aspect 18, wherein the first light source is an incandescent bulb, a halogen bulb, a fluorescent tube or a panel.

Aspect 20: The method of aspect 18, wherein the first light source is a light emitting diode (LED) light source in a form of an incandescent bulb, a halogen bulb, a fluorescent tube or a panel.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric. Unless indicated otherwise, percentages referring to composition are in terms of wt %.

There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

Figure 6A:
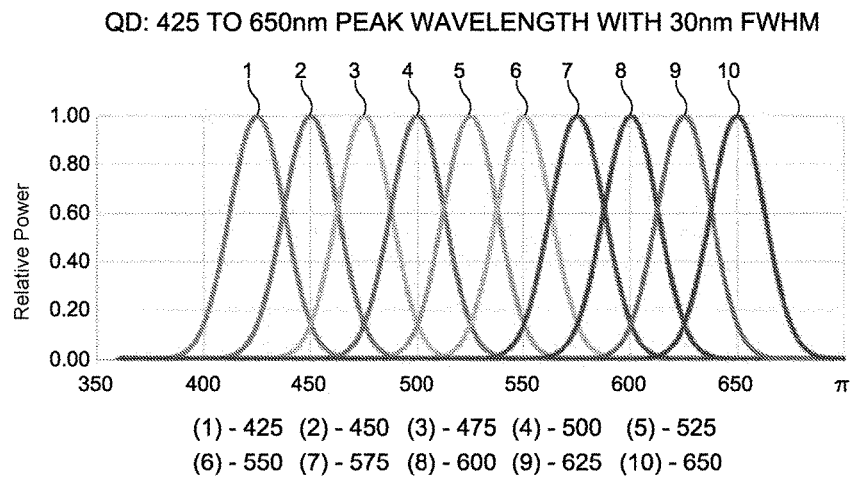
Figure 6B:
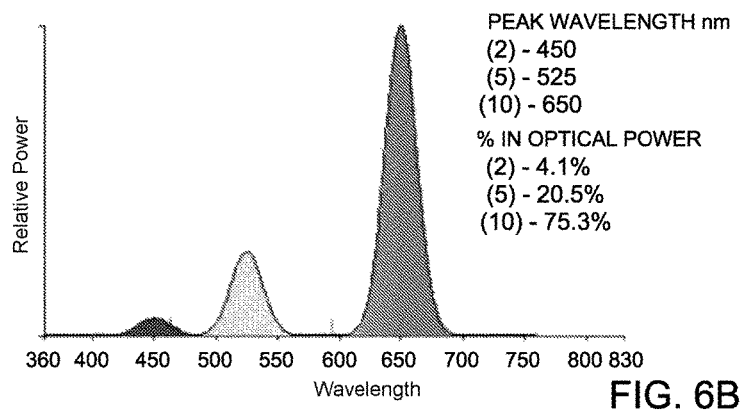

FIGS. 6A-6C provide exemplary illustrations of how high quality white light could be generated using an electroluminescent QD unit containing a plurality of monochromatic quantum dots according to aspects of the present disclosure. The spectral power distributions illustrated in these figures are provided based on optical simulation and calculation.

FIG. 6A illustrates various QDs having size-controlled tunable emission wavelengths and a narrow monochromatic emission spectrum. As shown, the ten QDs have varying peak wavelengths of from 425 to 650 nanometers (nm) (labeled from 1 to 10, respectively) and an assumed 30 nm full-width half-maximum wavelength. Multiple monochromatic quantum dot emissions would be mixed in order to generate white light.

As shown in FIG. 6B, warm white light having a color temperature of 2700K and having the right color coordinate falling on a black body locus can be generated by mixing QDs generating three RGB colors having the indicated wavelengths and proportion (450 nm (2): 4.1%, 525 nm (5): 20.5%, and 650 nm (10): 75.3%). As shown, however, the CRI is poor at −22.

FIG. 6C shows more promising possibilities. Mixing QDs generating five colors can provide both warm white light (2700K, CRI 94 and R1-R14>89 with 450 nm (2): 21.5%, 500 nm (4): 14.3%, 550 nm (6): 25.1%, 600 nm (8): 21.1%, and 650 nm (10): 17.9%) and cold white light (5000K, 85 CRI with 450 nm (2): 21.5%, 500 nm (4): 14.3%, 550 nm (6): 25.1%, 600 nm (8): 21.1%, and 650 nm (10): 17.9%) having the right optical power proportion falling on a black body locus. Even better, however, mixing QDs generating ten colors can result in high quality warm white light approximating that of an incandescent light bulb (2700K, CRI 97 and R1-R14>90 with 425 nm (1): 2.5%, 450 nm (2): 4.0%, 475 nm (3): 1.5%, 500 nm (4): 8.0%, 525 nm (5): 6.0%, 550 nm (6): 12.0%, 575 nm (7): 9.0%, 600 nm (8): 15.5%, 625 nm (9): 16.0%, and 650 nm (10): 25.5%).

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

That which is claimed is:

1. An apparatus comprising:
   a. a housing;
   b. an electroluminescent quantum dots (QD) unit as a light source, wherein the electroluminescent QD unit comprises a plurality of electroluminescent QDs located on an insulating substrate; and
   c. an electrical component for providing electrical energy to the electroluminescent QD unit,
   wherein the housing is in a form of an incandescent bulb, a halogen bulb, a fluorescent tube or a panel.

2. The apparatus of claim 1, comprising an optical component for diffusing light generated by the electroluminescent QD unit.

3. The apparatus of claim 2, wherein the optical component comprises a polymeric or glass material.

4. The apparatus according to claim 2, wherein the optical component comprises acrylic, polycarbonate, silicone, polyester or a combination thereof.

5. The apparatus according to claim 1, wherein the housing comprises one or more of a metal, glass and polymeric material.

6. The apparatus according to claim 1, wherein the electroluminescent QDs on the electroluminescent QD unit are electrically connected to the electrical component by conductive traces located on the insulating substrate.

7. The apparatus according to claim 1, wherein the insulating substrate comprises a glass or polymeric material.

8. The apparatus according to claim 1, wherein the insulating substrate is a flexible polymeric material.

9. The apparatus according to claim 1, wherein the electrical component is located within or on the housing of the apparatus.

10. The apparatus according to claim 1, wherein the electrical component is located outside the housing of the apparatus.

11. The apparatus according to claim 1, wherein the electroluminescent QD unit comprises a plurality of electroluminescent QDs printed on an insulating substrate and the plurality of electroluminescent QDs comprise chemically synthesized nanocrystal QDs or colloidal QDs.

12. The apparatus according to claim 1, wherein the apparatus is a lighting fixture.

13. The apparatus according to claim 1, wherein the light source is a source of ultraviolet light, infrared light or black light.

14. The apparatus according to claim 1, wherein the apparatus provides warm white light having a color temperature of about 2700 Kelvin (K), a color rendering index of about 97, and each of standard colors R1 to R14 having a value of about 90 or higher.

15. An apparatus comprising:
   a. a housing;
   b. an electroluminescent quantum dots (QD) unit as a light source, the electroluminescent QD unit comprising a plurality of quantum dots located on an insulating substrate comprising a flexible polymeric material; and
   c. an electrical component for providing electrical energy to the electroluminescent QD unit,
   wherein the housing is in a form of an incandescent bulb, a halogen bulb, a fluorescent tube or a panel, and
   wherein the insulating substrate is curved such that (1) the electroluminescent QD unit conforms to an outer shape of an incandescent bulb or a panel, or (2) the electroluminescent QD unit is shaped into a form of a halogen filament.

16. The apparatus of claim 15, comprising an optical component for diffusing light generated by the electroluminescent QD unit, wherein the optical component comprises a polymeric or glass material.

17. The apparatus of claim 15, wherein the optical component comprises acrylic, polycarbonate, silicone, polyester or a combination thereof.

18. The apparatus of claim 15, wherein the electroluminescent QD unit comprises a plurality of electroluminescent QDs printed on an insulating substrate and the plurality of electroluminescent QDs comprise chemically synthesized nanocrystal QDs or colloidal QDs.

19. The apparatus of claim 15, wherein the apparatus is a lighting fixture.

20. The apparatus of claim 15, wherein the light source is a source of ultraviolet light, infrared light or black light.

* * * * *